(12) United States Patent
Hosier et al.

(10) Patent No.: US 6,998,595 B2
(45) Date of Patent: Feb. 14, 2006

(54) COLOR FILTER CONFIGURATION FOR A SILICON WAFER TO BE DICED INTO PHOTOSENSITIVE CHIPS

(75) Inventors: Paul A. Hosier, Rochester, NY (US); Thomas Grimsley, Fairport, NY (US); Josef E. Jedlicka, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 350 days.

(21) Appl. No.: 09/802,792

(22) Filed: Mar. 8, 2001

(65) Prior Publication Data

US 2002/0125408 A1    Sep. 12, 2002

(51) Int. Cl.
*H01L 27/00* (2006.01)
(52) U.S. Cl. ............. 250/208.1; 257/620; 438/68
(58) Field of Classification Search ............. 250/208.1, 250/239, 214.1, 216, 226; 257/290–291, 257/431–437, 440, 466, 620, 443–444; 358/512–514, 358/482–483; 438/75, 70, 68–69, 113–114
See application file for complete search history.

(56) References Cited

U.S. PATENT DOCUMENTS

| | | | |
|---|---|---|---|
| 5,135,891 A * | 8/1992 | Ikeno et al. | 438/424 |
| 5,219,796 A | 6/1993 | Quinn et al. | 437/227 |
| 5,521,125 A | 5/1996 | Ormond et al. | 437/227 |
| 5,604,362 A | 2/1997 | Jedlicka et al. | 257/233 |
| 5,648,653 A * | 7/1997 | Sakamoto et al. | 250/208.1 |
| 5,696,626 A | 12/1997 | Hosier et al. | 358/482 |
| 5,698,892 A * | 12/1997 | Koizumi et al. | 257/620 |
| 6,066,883 A | 5/2000 | Hosier et al. | 257/452 |
| 6,111,247 A | 8/2000 | Sengupta | 250/226 |
| 6,157,019 A | 12/2000 | Hosier | 250/208.1 |
| 6,201,293 B1 * | 3/2001 | Ormond et al. | 257/667 |
| 6,242,730 B1 * | 6/2001 | Lin et al. | 250/208.1 |

* cited by examiner

*Primary Examiner*—Seung C. Sohn
(74) *Attorney, Agent, or Firm*—R. Hutter

(57) ABSTRACT

An architecture and manufacturing method for photosensitive chips, such as used in office equipment and digital cameras, involves creating grooves between chip areas in a wafer, and then placing a light-transmissive planar layer over the main surface of the wafer. The planar layer, which may be acrylic-based, creates a substantially planar surface over both the photosites in the chip areas and the grooves. The planar layer in turn supports one or more light-transmissive filtering layers. The arrangement avoids damage to the filtering layers when the wafer is diced along the grooves.

9 Claims, 3 Drawing Sheets

COLOR FILTER CONFIGURATION FOR A SILICON WAFER TO BE DICED INTO PHOTOSENSITIVE CHIPS

CROSS-REFERENCE TO RELATED APPLICATION

Cross-reference is hereby made to the following co-pending U.S. patent application, assigned to the assignee hereof: "Systems and Methods for Fabricating an Electro-Optical Device Used for Image Sensing," Ser. No. 09/750,425, Filed Dec. 28, 2000.

FIELD OF THE INVENTION

The present invention relates to photosensitive chips for creating electrical signals from an original image, as would be found, for example, in a digital scanner or facsimile machine. More specifically, the present invention relates to a design for a photosensitive chip with a thin-film color filter attached thereto.

BACKGROUND OF THE INVENTION

As copying and scanning of color hard-copy documents becomes more prevalent in the business world, there has arisen a need for full-color solid-state photosensitive devices, such as a silicon chip having an array of photosensors thereon. One prior-art for causing the photosensors on the silicon chip to be sensitive to a specific primary color is to provide, on the main surface of the silicon chip, a layer of spectrally transparent filter material, such as polyimide or acrylic, which has been dyed or pigmented to a specific primary color. If a single photosensitive chip is intended to have multiple linear arrays of photosensors, each linear array being sensitive to one particular primary color, particular polyimide layers are applied to specific linear arrays, thereby creating a full-color photosensitive chip.

One typical method of construction of full-color photosensitive chip is to first create a wafer having a relatively large number, such as one hundred or more, of semiconductor structures, each structure corresponding to one chip. Filters are applied to the structures on the wafer so that filter areas will be applied to the desired linear arrays of photosensors on each chip structure. Typically this application of filter material is carried out by applying an even layer of translucent liquid to the entire wafer, developing the desired areas of the filter material with a photo mask, and then etching away the translucent material in all other areas. For full-color chips, multiple layers of translucent filter material are applied to the wafer, and then etched away as needed, to yield the three primary-color-filtered linear arrays of photosensors. Only after the filter layers are applied as desired is the wafer "diced," or sawed into individual chips. According to one technique, the chip termination is a combination of chemically-etched v-groove and a mechanically sawed portion. The diced chips are first tested and screened for defective chips, and the usable chips are then abutted into a longer linear array.

In the construction of full-color photosensitive chips having translucent filter layers attached thereto, certain practical problems are evident. One problem concerns the inadvertent ripping or other damage to the cured filter layers when the wafer is diced into individual chips: the relatively thin translucent filter layer, particularly at the photosensors toward either end of the chip, can be torn by the action of a saw blade. If the translucent color filter is torn in a manner that even a very small portion (as little as 1%) of the area of one photosite is exposed to unfiltered white light, this extra light thus introduced to the photosite will have an appreciable effect on resulting image quality. It is therefore crucial that the translucent filters be placed on a wafer from which chips are created such that the integrity of the filters is maintained throughout the manufacturing process.

DESCRIPTION OF THE PRIOR ART

U.S. Pat. No. 5,219,796 discloses the basic concept of dicing image sensor chips from a wafer.

U.S. Pat. No. 5,521,125 discloses a technique of dicing silicon chips from a wafer. "Streets" of relatively deep trenches are formed between the functional chip areas of the wafer, and a shock absorbent material is a deposited in the streets, forming a concave meniscus therein. The shock absorbent material retards the trajectories of silicon particles set into motion when the wafer is diced into chips.

U.S. Pat. No. 5,604,362 discloses covering essentially the entire main surface of a photosensor chip with a highly light-absorbing filter layer, to avoid stray reflections from non-photosite portions of a photosensor chip.

U.S. Pat. No. 5,696,626 discloses the design of a photosensitive chip wherein each photosite is covered with a filter formed from a cured translucent liquid. At the critical ends of the chip, between the end photosite and the edge of the chip, there is provided a ridge which protrudes over the regular thickness of the filter. This ridge maintains the physical integrity of the filter, particularly during a dicing process.

U.S. Pat. No. 6,111,247 discloses an imaging chip having a sensor portion and a non-sensor portion disposed about the periphery of the sensor portion, a passivation layer overlying a portion of a top surface of the sensor portion, and a protection layer overlying the passivation layer.

U.S. Pat. No. 6,066,883 discloses using a "guard ring," in the form of a biased diffusion area, to avoid the influence of stray light in an edge photosite in a photosensor chip.

U.S. Pat. No. 6,157,019 discloses a configuration of photosensitive chips in which photosites immediately adjacent to a functional edge of the chip are shielded and thus defined with an opaque layer that overlaps the diced region and preserves the integrity of the filter layers while eliminating the need for a guard ring.

SUMMARY OF THE INVENTION

According to one aspect of the present invention, there is provided a photosensitive chip for use in an imaging apparatus, comprising a main surface, having at least one photosite thereon, the main surface defining an edge. A groove portion is defined at the edge. A light-transmissive planar layer is disposed over the main surface, the planar layer forming a planar surface substantially parallel with the main surface, the planar layer extending over the groove portion. A light-transmissive filtering layer is disposed over the planar layer.

According to another aspect of the present invention, there is provided an imaging apparatus including at least one photosensitive chip. The chip comprises a main surface, having at least one photosite thereon, the main surface defining an edge. A groove portion is defined at the edge. A light-transmissive planar layer is disposed over the main surface, the planar layer forming a planar surface substantially parallel with the main surface, the planar layer extending over the groove portion.

According to another aspect of the present invention, there is provided an integrated circuit wafer, comprising a first chip area defined in a main surface of the wafer, the first chip area including structure related to a first photosite. A groove is defined in the wafer, the groove defining at least one edge of the first chip area. A light-transmissive planar layer is disposed over the main surface, the planar layer forming a planar surface substantially parallel with the main surface, the planar layer extending over the groove.

According to another aspect of the present invention, there is provided a method of making photosensitive chips for use in an imaging apparatus, comprising the steps of providing an integrated circuit wafer, the wafer comprising a first chip area defined in a main surface of the wafer, the first chip area including structure related to a first photosite, and a groove defined in the wafer, the groove defining at least one edge of the first chip area, and providing a light-transmissive planar layer over the main surface, the planar layer forming a planar surface substantially parallel with the main surface, the planar layer extending over the groove.

DETAILED DESCRIPTION OF THE INVENTION

Figure 1:
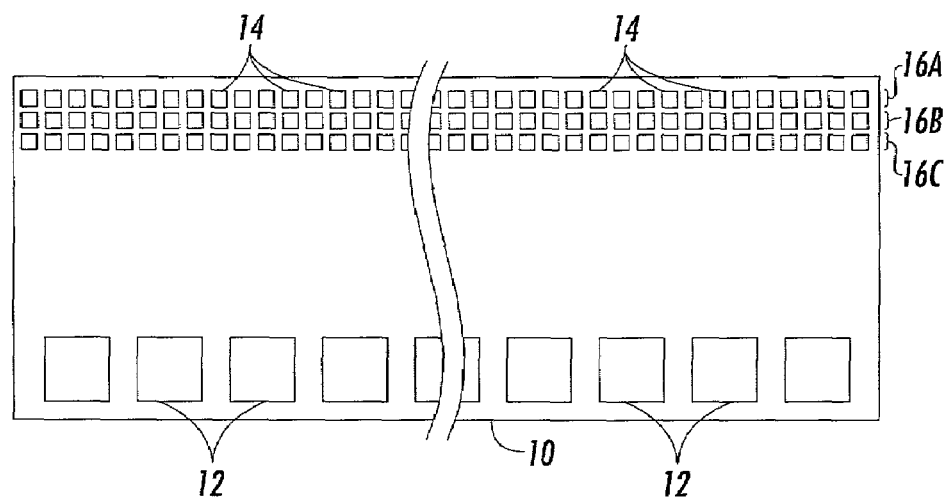
FIG. 1 is a plan view of a single photosensitive chip of a general design found, for example, in a full-color photosensor scanner.

FIG. 1 is a plan view of a single photosensitive chip, generally indicated as 10, of a design found, for example, in a full-color photosensor scanner or digital camera. A typical design of a full-page-width scanner will include a plurality of chips 10, each chip being approximately one-half to one inch in length, the chips being butted end-to-end to form an effective collinear array of photosensors, which extends across a page image being scanned. Each chip 10 is a silicon-based integrated circuit chip having defined in a main surface thereof three independently-functioning linear arrays of photosensors, each photosensor being here indicated as 14. A number of contact pads 12 are used for external circuitry to interact with circuitry (not shown) inside the chip 10, such as to provide instructions to the chip 10 or receive video signals from the chip 10. The photosensors are disposed in three parallel rows which extend across a main dimension of the chip 10, these individual rows being shown as 16A, 16B, and 16C. Each individual row of photosensors on chip 10 can be made sensitive to a particular color, by applying to the particular row a spectrally translucent filter layer which covers only the photosensors in a particular row. In a preferred embodiment of the present invention, the three rows of photosensors are each filtered with a different primary color, such as red, green, and blue. Generally, each individual photosensor 14 is adapted to output a charge or voltage signal indicative to the intensity of light of a certain type impinging thereon; various structures, such as transfer circuits, or charge-coupled devices, are known in the art for processing signal output by the various photosensors corresponding to photosites 14.

Also shown in FIG. 1 is any number of contact pads 12 by which circuitry within the chip 10 is connected to circuitry in a larger device, such as a hard-copy scanner in a digital copier or facsimile machine.

Figure 2:
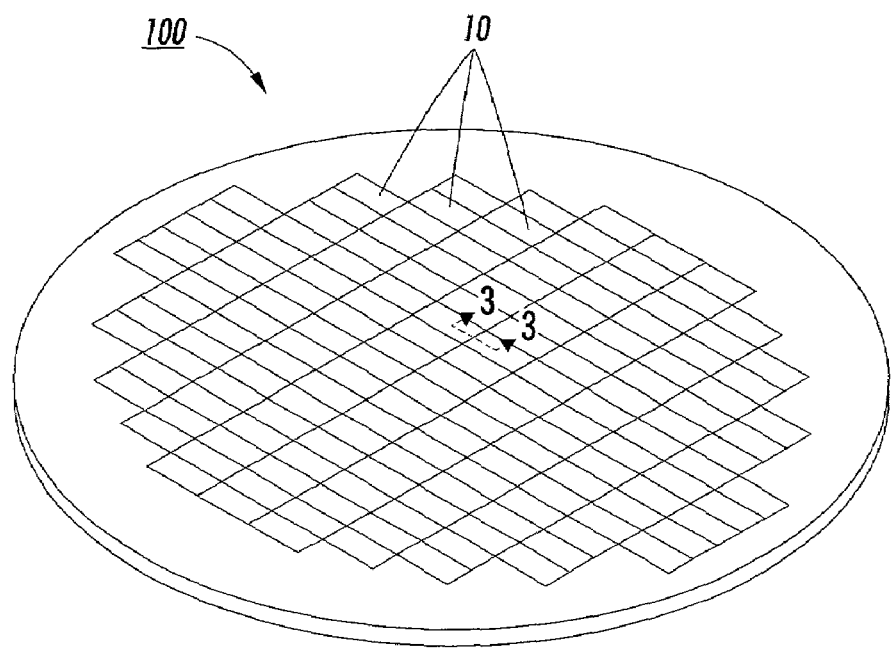
FIG. 2 is a perspective view of a wafer from which chips may be diced pursuant to the present invention.
Figure 3:
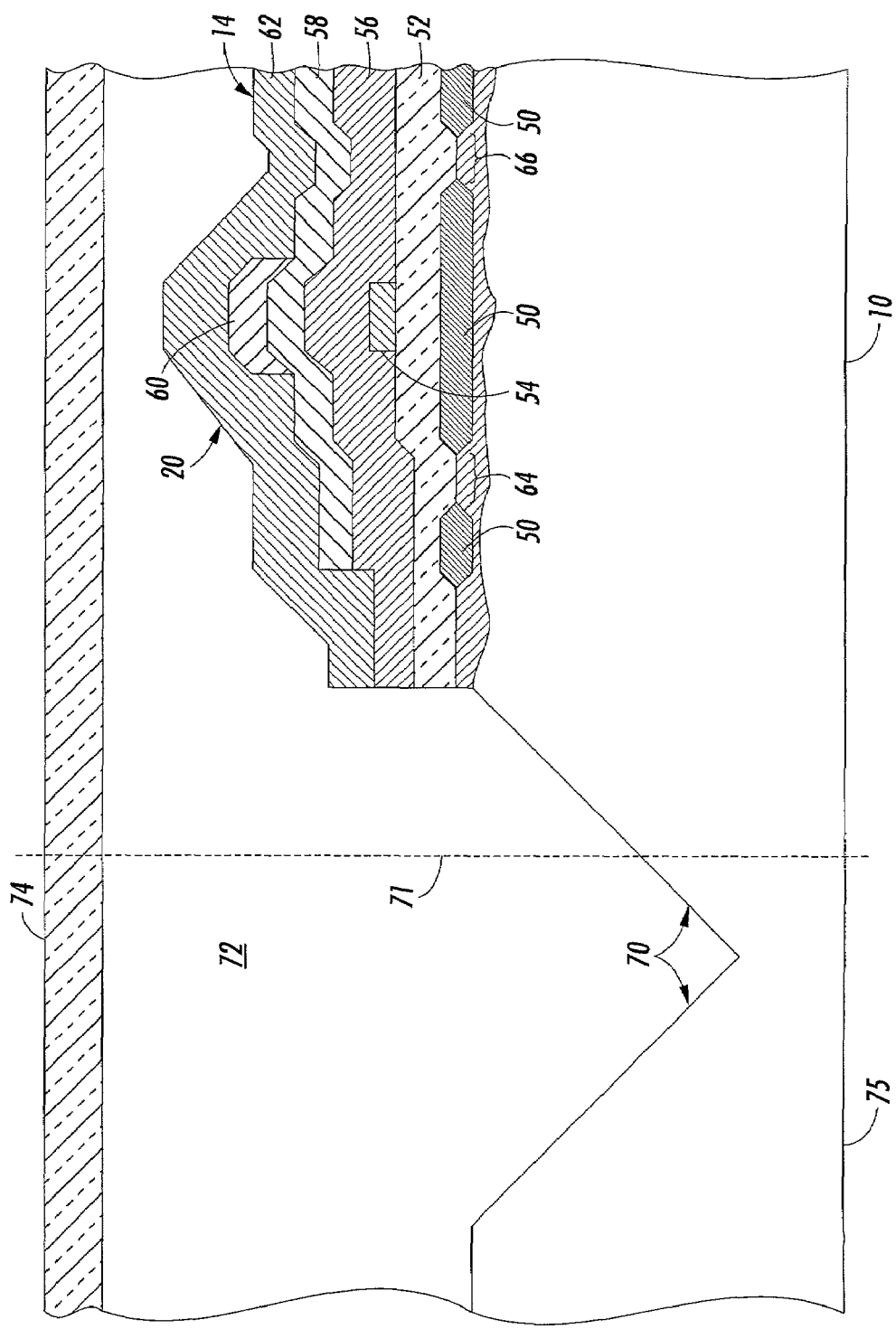
FIG. 3 is a detailed cross-sectional view showing the internal structure of a chip according to the present invention, along with a filter architecture pursuant to the present invention.

The view shown in FIG. 3 corresponds to the cross-section through line marked 3—3 in FIG. 2, in the case where a particular chip 10 is still formed as part of a wafer, from which it and any number of other chips are diced. In the illustrated embodiment, there is provided a ridge 20 which protrudes from the main surface of the chip, and is disposed to extend between the perimeter of an end photosite 14 disposed at the end of a particular chip 10, and the edge of the chip, as shown in FIG. 2. This ridge 20 protrudes a significant distance from the main surface of the chip, typically about 0.8 to 1.2 micrometers from the surface formed by the end photosite 14.

With regard to the specific internal structure of a chip 10 in the illustrated embodiment, all of the interconnect layers on the chip 10 are formed on a field oxide indicated as 50, the specific structure of which is not germane to the present invention. Above this field oxide is a borophosphosilicon glass, indicated as 52. There is also a metal structure 54, which is typically made of aluminum, first and second layers 56 and 58 of inter-metal oxide, and further a light shield indicated as 60. The topmost layer of both ridge 20 and the neighboring structures on the chip is a top oxide layer here indicated as 62. Also shown in this particular embodiment are doped implants 64 and 66: implant 64 is an optional guardring structure useful in some chip designs, while 66 forms part of a "doughnut" structure familiar in some designs of CMOS photosensors.

When chips such as 10 are still part of an original wafer, as shown in FIG. 3, in this embodiment of the invention the portions of the wafer corresponding to individual chips are separated by a relatively deep groove 70, which can be an etched V-groove, as shown, or alternately some other trench-like structure. Dimensionally, groove 70 should be wide enough to accommodate the edge placement variation of the dicing blade which separates the chip areas into chips: a typical location of the edge of the portion of the wafer removed by a dicing blade is shown as line 71. Once again, a basic description of the dicing process is given, for instance, in U.S. Pat. Nos. 5,219,796 and 5,696,626, cited above.

With particular reference to the present invention, there is further shown in FIG. 3 the structure of light-transmissive filter layers which are placed over the wafer forming a plurality of chips 10. As shown, a planar layer 72 is placed over the entire structure and allowed to fill groove 70 and cover ridge 20, yielding a substantially planar surface generally parallel to the main surface of chip 10. Over this planar surface is placed a filtering layer 74. Both planar layer 72 and filtering layer 74 are preferably made of a relatively brittle or glassy material, such as acrylic, which is placed over the chip 10 in a liquid form and allowed to harden or dry by various means known in the art.

Different requirements of an imaging apparatus will mandate that respective layers 72, 74 have various light-transmitting properties, such as transparency, translucence, opacity, etc., with respect to any or all wavelengths. In one practical embodiment of the invention, planar layer 72 is substantially transmissive of all visible wavelengths of light, and filtering layer 74 is transmissive of only a portion of the visible spectrum. In an apparatus for recording visible light, different types of filtering layers 74, transmitting different portions of the spectrum, can be used to create a photosensor chip, such as shown in FIG. 1, in which each row 16A, 16B, 16C of photosites can be made sensitive to one primary color.

Figure 4:
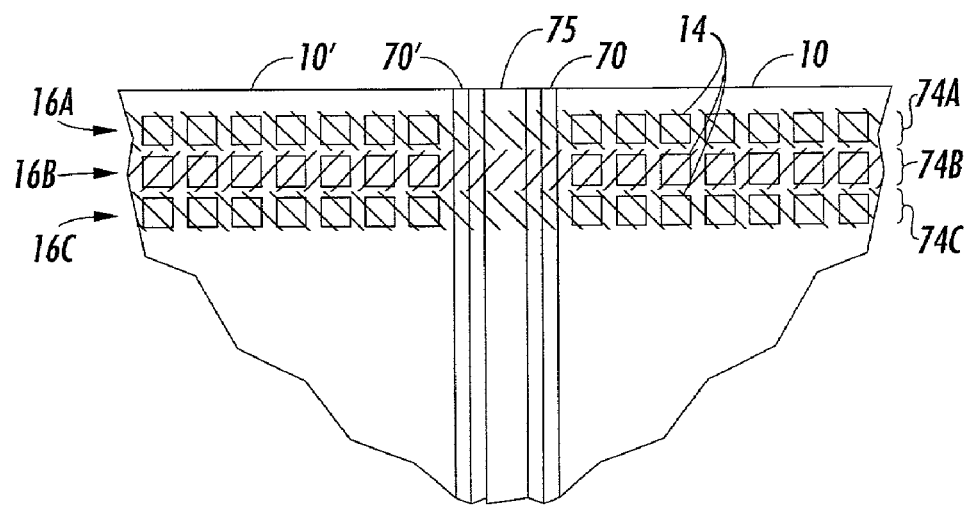
FIG. 4 is a plan view showing the configuration of various translucent filtering layers over a chip when the chip is attached to an adjacent chip within a wafer pursuant to the present invention.

FIG. 4 is a plan view showing the configuration of various types of filtering layers 74 over a chip 10 and an adjacent chip 10' within a wafer. In this particular embodiment, there is provided a relatively short "scribe area" 75 of otherwise unused wafer area between chips 10 and 10', and successive blade cuts are used to cut through the respective grooves 70 and 70', as described, for example, in U.S. Pat. No. 5,219, 796. As shown, in this view there are provided three distinct filtering layers, indicated as 74A, 74B, and 74C. which respectively cover rows of photosites 14 described above as 16A, 16B, and 16C. Typically, the three types of filters 74 will each transmit only one primary color, red, green, or blue, so that the chip 10 itself can output image data reflective of the entire visible spectrum, as is familiar in the art. Significantly, as shown in FIG. 4, the respective areas covered by filters 74A, 74B, and 74C each extend over one linear array. i.e., rows 16A, 16B, and 16C of photosites 14; and the same filter area such as 74A for one chip 10 extends across the groove 70, scribe area 75, another groove 70', and over the equivalent row such as 16A for the adjacent chip 10'. Indeed, if there are a number of chips 10 in a row along one dimension In a wafer, each filtered area should extend across the suitable row 16 of photosites for as many chips 10 as is geometrically possible. Once again, where a filter 74 extends over a groove 70, the filter 74 is disposed over and supported by a clear layer 72 (as shown in FIG. 3) which presents a substantially planar surface over the groove 70.

The described configuration of filter layers 72 and 74 yields desirable practical results in the dicing process. When a wafer is diced, such as along a groove 70, the fact that each filter layer 74 is disposed over and supported by clear layer 72, which itself takes up most of the void formed by the groove 70, the filter layer 74 exhibits very little damage or tearing, especially in the portions thereof around any photosites 14. Also helpful is the use of acrylic-based material, the essential nature of which is known in the art, for layers 72 and 74. As mentioned above, the avoidance of disturbances to the filter layers 74 over the photosites is crucial to creation of a reliable photosensor chip 10.

Figure 5:
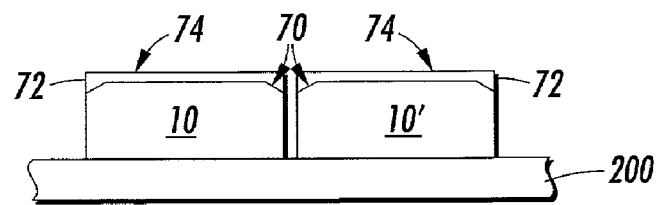
FIG. 5 is an elevational view of a portion of a photosensitive device including chips made pursuant to the present invention.

FIG. 5 is an elevational view showing relevant portions of an example photosensor device, such as could be used in conjunction with a digital copier or facsimile, using chips 10 made according to the present invention. Two chips 10 and 10' are disposed on a substrate 200. (Of course, in a full-page-width array of butted chips such as used, for example, in a digital copier or facsimile, there may be as many as twenty such chips arranged on a substrate.) The respective sets of photosites in each chip may be configured, such as by butting or spacing the chips closely together, to yield what is in effect a single functional array of photosites, as is familiar in the art. Each chip includes, at critical edges thereof, portions of grooves 70, as described above, which are remnants of the dicing process. Each chip further includes a layer 72 which, even in the finished chip, has the effect of creating a substantially planar surface of the portion of groove 70. The layer 72 is, in this embodiment, light-transmissive. Disposed over the planar surface of layer 72 is a light-transmissive layer 74, which may be a translucent color filter for at least one set of photosites on the chip.

The invention claimed is:

1. An imaging apparatus having a first photosensitive chip, the chip comprising:
    a main surface, having at least one photosite thereon, the main surface defining an edge;
    a groove portion defined at the edge;
    a light-transmissive planar layer disposed over the main surface, the planar layer forming a planar surface substantially parallel with the main surface, the planar layer extending over the groove portion; and
    a light-transmissive filtering layer disposed over the planar layer.

2. The apparatus of claim 1, the planar layer comprising acrylic.

3. The apparatus of claim 1, the filtering layer comprising acrylic.

4. The apparatus of claim 1, the planar layer being substantially transmissive of visible light, and the filtering layer being transmissive of a predetermined range of wavelengths of light.

5. The apparatus of claim 1, the filtering layer comprising a first portion transmissive of a first predetermined range of wavelengths of light and a second portion transmissive of a second predetermined range of wavelengths of light.

6. The apparatus of claim 5, the chip including a plurality of photosites on the main surface thereof, the first portion being disposed over a first set of photosites on the first chip and the second portion being disposed over a second set of photosites on the first chip.

7. The apparatus of claim 1, further comprising a second photosensitive chip, the second chip having a planar layer and a filtering layer arranged substantially similarly to the first chip.

8. The apparatus of claim 1, further comprising a second photosensitive chip, the second chip having a plurality of photosites thereon, the first chip and the second chip being arranged to yield a single functional array of photosites.

9. The apparatus of claim 8, the second chip having a planar layer and a filtering layer arranged substantially similarly to the first chip.

* * * * *